US010555075B2

(12) United States Patent
Shinotsuka et al.

(10) Patent No.: US 10,555,075 B2
(45) Date of Patent: Feb. 4, 2020

(54) ACOUSTIC CHARACTERISTIC CALIBRATION METHOD, ACOUSTIC CHARACTERISTIC CALIBRATION DEVICE, AND FFT CIRCUIT

(71) Applicant: HONDA MOTOR CO., LTD., Tokyo (JP)

(72) Inventors: Sukeyuki Shinotsuka, Tochigi (JP); Yuta Sugawara, Tochigi (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 15/685,170

(22) Filed: Aug. 24, 2017

(65) Prior Publication Data

US 2018/0091895 A1 Mar. 29, 2018

(30) Foreign Application Priority Data

Sep. 28, 2016 (JP) .................................. 2016-190453

(51) Int. Cl.
*H04R 29/00* (2006.01)
*H04R 1/40* (2006.01)
(Continued)

(52) U.S. Cl.
CPC ............... *H04R 1/40* (2013.01); *G01R 23/15* (2013.01); *H04R 3/002* (2013.01); *H04R 3/005* (2013.01);
(Continued)

(58) Field of Classification Search
CPC .......... H04R 1/40; H04R 3/002; H04R 3/005; H04R 29/002; H04R 29/006; H04R 3/04;
(Continued)

(56) References Cited

U.S. PATENT DOCUMENTS 6,965,928 B1 * 11/2005 Cox ...................... H04L 41/082
709/203
7,062,523 B1 * 6/2006 Hoffman ............... G06F 17/142
708/403

(Continued)

FOREIGN PATENT DOCUMENTS

| CN | 1388726 A | 1/2003 |
| JP | 09-210865 | 8/1997 |
| JP | 2000-121684 | 4/2000 |
| JP | 3150446 | * 5/2000 |
| JP | 3150446 U | 5/2009 |

OTHER PUBLICATIONS

William F. Lipstreu, "Digital Signal Processing Laboratory Using Real-Time Implementations Of Audio Applications" (Year: 2009).*

*Primary Examiner* — Vivian C Chin
*Assistant Examiner* — Con P Tran
(74) *Attorney, Agent, or Firm* — Rankin, Hill & Clark LLP

(57) ABSTRACT

The present invention provides an acoustic characteristic calibration method superior in at least one of improved repeatability of an inspection state, a reduced influence of a noise in calibrating an acoustic characteristic, and a reduced load in FFT arithmetic processing. A reference acoustic signal is output from a sound output unit (10) and input to a sound input unit (20) of a vehicle inspection device (2). The signal input to the sound input unit (20) is subjected to A/D conversion, and then the FFT arithmetic processing is carried out thereby to detect the frequency response characteristic of the sound input unit (20). The frequency response characteristic of the sound input unit (20) and the frequency characteristic of the reference acoustic signal are compared to determine the correction factor at each frequency. Based on the correction factor, the frequency response characteristic of the sound input unit (20) is calibrated.

10 Claims, 9 Drawing Sheets

(51) Int. Cl.
*G01R 23/15* (2006.01)
*H04R 3/00* (2006.01)

(52) U.S. Cl.
CPC ......... *H04R 29/002* (2013.01); *H04R 29/006* (2013.01)

(58) Field of Classification Search
CPC .......................... H04R 29/001; H04R 29/004; H04R 2430/03; H04R 2499/11; H04R 2499/13; G01R 23/15; G01R 23/16; G01R 35/00
USPC ................................ 381/92, 58, 56, 122, 98
See application file for complete search history.

(56) References Cited

U.S. PATENT DOCUMENTS

| | | | | |
|---|---|---|---|---|
| 2003/0145026 | A1* | 7/2003 | Jin | G06F 17/142 |
| | | | | 708/404 |
| 2004/0175014 | A1* | 9/2004 | Liu | F21V 33/0056 |
| | | | | 381/386 |
| 2008/0300867 | A1* | 12/2008 | Yan | G10L 17/26 |
| | | | | 704/207 |
| 2011/0081023 | A1* | 4/2011 | Raghuvanshi | H04S 7/30 |
| | | | | 381/17 |

* cited by examiner

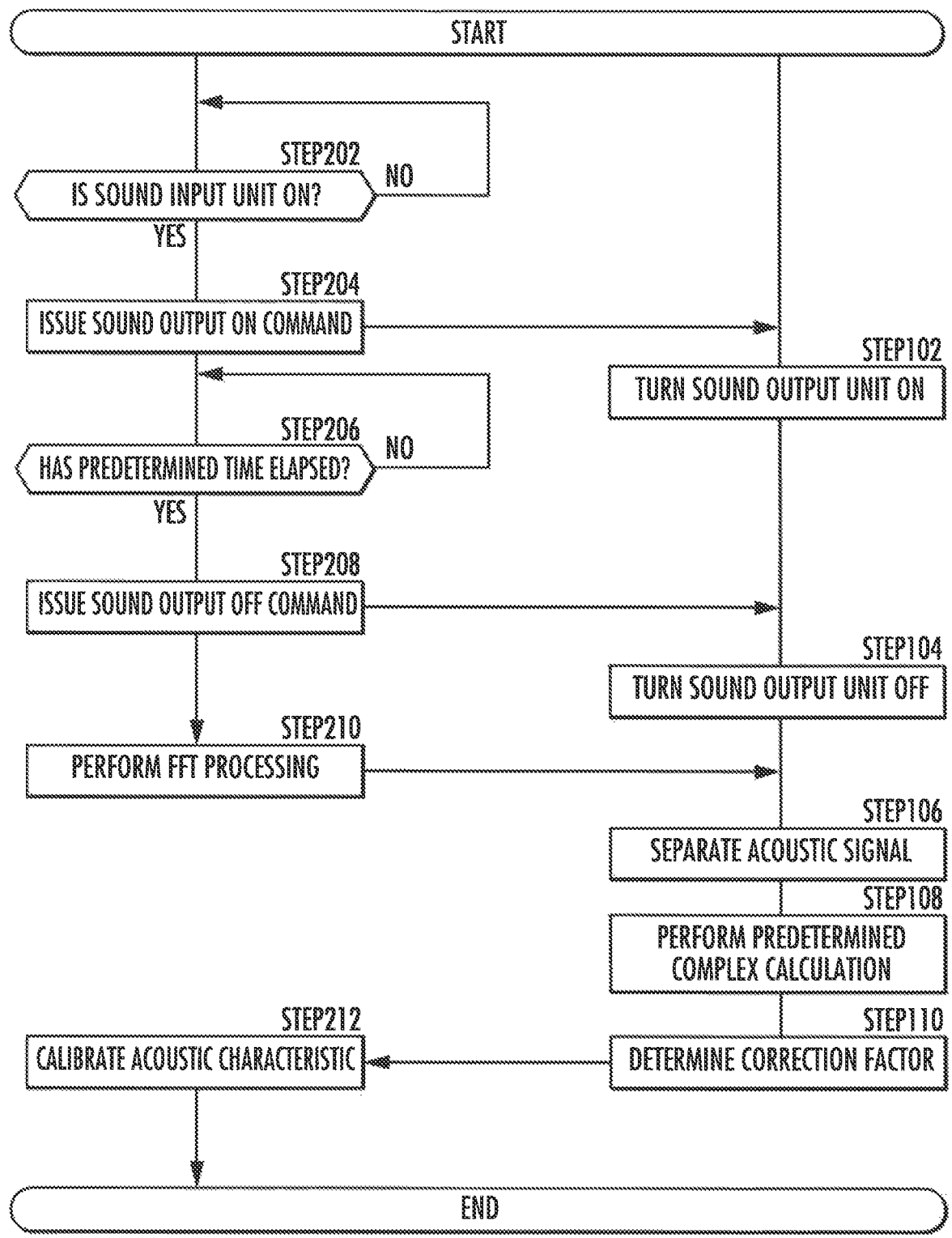

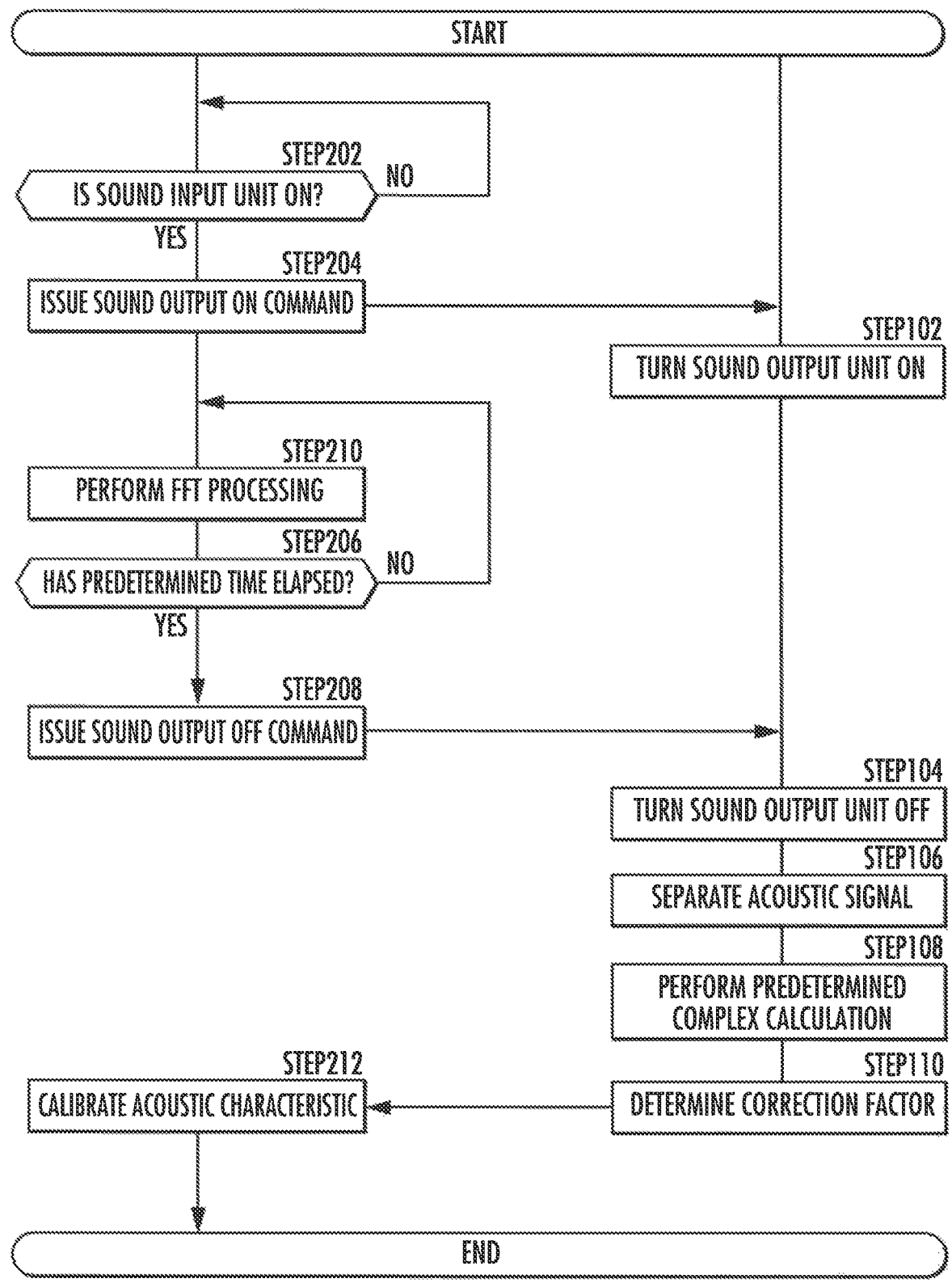

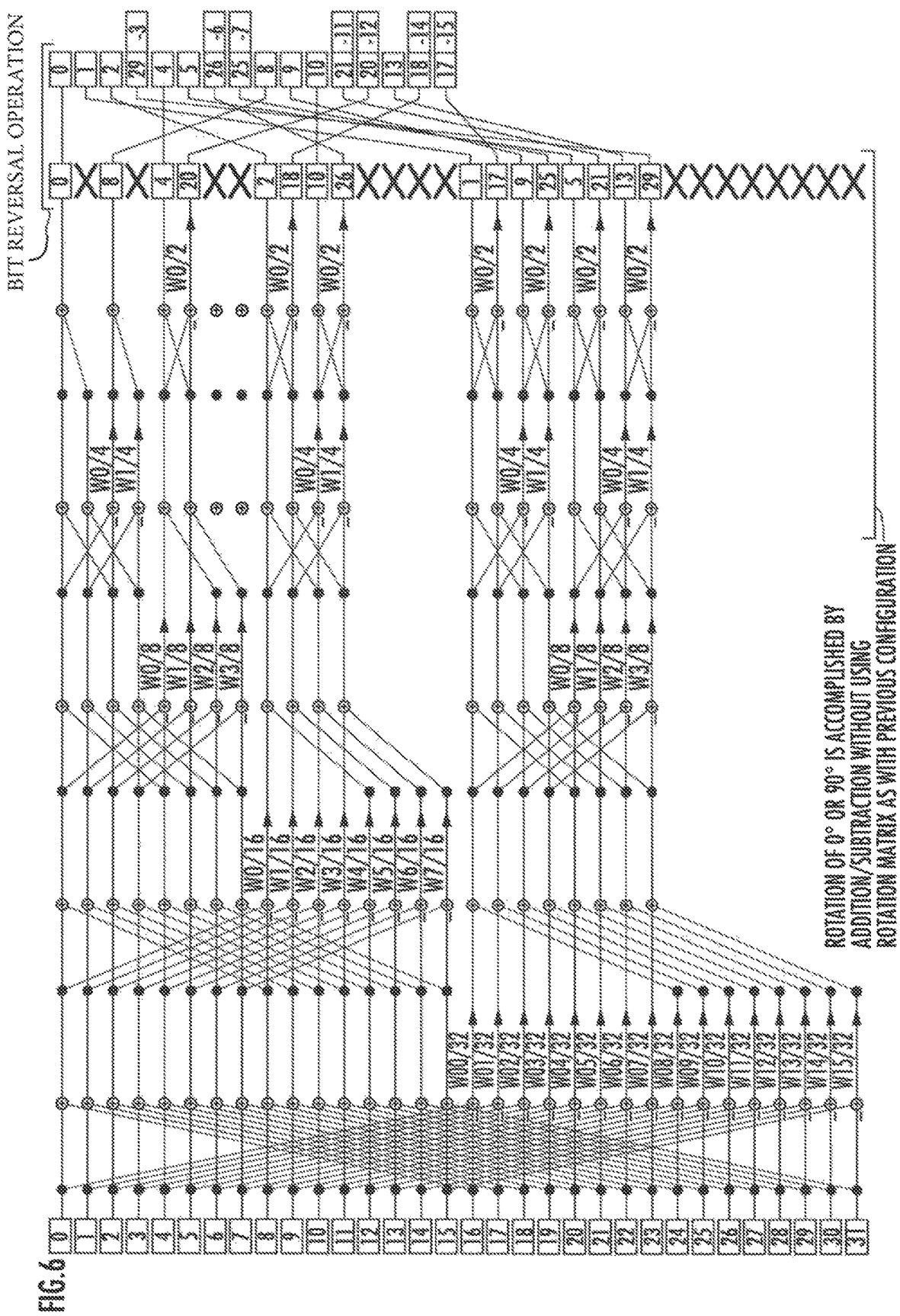

FIG. 8

| | FFT STANDARD TYPE (WITHOUT MIRROR IMAGE) | | STANDARD TYPE (FINAL STAGE IS COMPOSED OF ADDITION/SUBTRACTION) | | STANDARD TYPE (FINAL STAGE IS COMPOSED OF ADDITION/SUBTRACTION) (DELETE MIRROR IMAGE BIN) | | WITH MIRROR IMAGE (MODIFIED STANDARD TYPE) | | WITH MIRROR IMAGE (FINAL STAGE IS COMPOSED OF ADDITION/SUBTRACTION) | |
|---|---|---|---|---|---|---|---|---|---|---|
| Bit / N | COMPLEX ADDITION/ SUBTRACTION | ROTATION CALCULATION | COMPLEX ADDITION/ SUBTRACTION | ROTATION CALCULATION | COMPLEX ADDITION/ SUBTRACTION | ROTATION CALCULATION | COMPLEX ADDITION/ SUBTRACTION | ROTATION CALCULATION | COMPLEX ADDITION/ SUBTRACTION | ROTATION CALCULATION |
| 2 / 4 | 8 | 4 | 8 | 0 | 0 | 0 | 6 | 2 | 6 | 0 |
| 3 / 8 | 24 | 12 | 24 | 4 | 20 | 4 | 18 | 7 | 18 | 2 |
| 4 / 16 | 64 | 32 | 64 | 16 | 56 | 16 | 46 | 19 | 46 | 10 |
| 5 / 32 | 160 | 80 | 160 | 48 | 144 | 48 | 110 | 47 | 110 | 30 |
| 6 / 64 | 384 | 192 | 384 | 128 | 352 | 128 | 254 | 111 | 254 | 78 |
| 7 / 128 | 896 | 448 | 896 | 320 | 832 | 320 | 574 | 255 | 574 | 190 |
| 8 / 256 | 2048 | 1024 | 2048 | 768 | 1920 | 768 | 1278 | 575 | 1278 | 446 |
| 9 / 512 | 4608 | 2304 | 4608 | 1792 | 4352 | 1792 | 2814 | 1279 | 2814 | 1022 |
| 10 / 1024 | 10240 | 5120 | 10240 | 4096 | 9728 | 4096 | 6142 | 2815 | 6142 | 2302 |
| 11 / 2048 | 22528 | 11264 | 22528 | 9216 | 21504 | 9216 | 13310 | 6143 | 13310 | 5118 |
| 12 / 4096 | 49152 | 24576 | 49152 | 20480 | 47104 | 20480 | 28670 | 13311 | 28670 | 11262 |

| Bit / N | COMPLEX ADDITION/ SUBTRACTION | ROTATION CALCULATION | COMPLEX ADDITION/ SUBTRACTION | ROTATION CALCULATION | COMPLEX ADDITION/ SUBTRACTION | ROTATION CALCULATION | COMPLEX ADDITION/ SUBTRACTION | ROTATION CALCULATION | COMPLEX ADDITION/ SUBTRACTION | ROTATION CALCULATION |
|---|---|---|---|---|---|---|---|---|---|---|
| 2 / 4 | 1.00 | 1.00 | 1.00 | 0.00 | 0.75 | 0.00 | 0.75 | 0.30 | 0.75 | 0.00 |
| 3 / 8 | 1.00 | 1.00 | 1.00 | 0.33 | 0.83 | 0.33 | 0.75 | 0.38 | 0.75 | 0.17 |
| 4 / 16 | 1.00 | 1.00 | 1.00 | 0.50 | 0.88 | 0.50 | 0.72 | 0.59 | 0.72 | 0.31 |
| 5 / 32 | 1.00 | 1.00 | 1.00 | 0.60 | 0.90 | 0.60 | 0.69 | 0.59 | 0.69 | 0.38 |
| 6 / 64 | 1.00 | 1.00 | 1.00 | 0.67 | 0.92 | 0.67 | 0.66 | 0.58 | 0.66 | 0.41 |
| 7 / 128 | 1.00 | 1.00 | 1.00 | 0.71 | 0.93 | 0.71 | 0.64 | 0.57 | 0.64 | 0.42 |
| 8 / 256 | 1.00 | 1.00 | 1.00 | 0.75 | 0.94 | 0.75 | 0.62 | 0.56 | 0.62 | 0.44 |
| 9 / 512 | 1.00 | 1.00 | 1.00 | 0.78 | 0.94 | 0.78 | 0.61 | 0.56 | 0.61 | 0.44 |
| 10 / 1024 | 1.00 | 1.00 | 1.00 | 0.80 | 0.95 | 0.80 | 0.60 | 0.55 | 0.60 | 0.45 |
| 11 / 2048 | 1.00 | 1.00 | 1.00 | 0.82 | 0.95 | 0.82 | 0.59 | 0.55 | 0.59 | 0.45 |
| 12 / 4096 | 1.00 | 1.00 | 1.00 | 0.83 | 0.96 | 0.83 | 0.58 | 0.54 | 0.58 | 0.46 |

ACOUSTIC CHARACTERISTIC CALIBRATION METHOD, ACOUSTIC CHARACTERISTIC CALIBRATION DEVICE, AND FFT CIRCUIT

BACKGROUND OF THE INVENTION

Field of the Invention

The present invention relates to a method and a device for calibrating the acoustic characteristic of a device that has an acoustic inspection function, and fast Fourier transform (FFT) circuit.

Description of the Related Art

In the process of final inspection of a vehicle provided with a plurality of (e.g. over a few hundred of) electronic control units (ECUs), a vehicle inspection device (line end tester (LET)) is used to determine or diagnose whether the functions of the ECUs and devices electrically connected to the ECUs are normal or abnormal.

The vehicle inspection device includes a microphone used to inspect for the normality of the sounds emitted from the acoustic devices of a vehicle. Hence, a reference sound having its acoustic characteristic measured beforehand is used to check the acoustic characteristic or the sensitivity characteristic of the microphone. More specifically, the reference sound is input to the microphone to measure the sensitivity of the microphone, and the deviation of the measurement value from a reference value (the acoustic characteristic of a sound source measured by a noise meter) of the microphone sensitivity is measured. Then, the offset or sensitivity of the microphone is corrected (refer to, for example, Japanese Patent Application Laid-Open No. 2000-121684 and Japanese Patent Application Laid-Open No. 9-210865).

However, according to the conventional calibration methods, the calibration is required to be performed with high repeatability by using a small sound source. In addition, the calibration is required to be easy even in a noisy environment of a plant. Further, when a vehicle inspection device is used to perform the acoustic inspection, the inspection has to be focused on a particular sound. It is publicly known that, in FFT processing, the circuit scale is reduced by repeatedly carrying out processing, whereas the number of times of communication between memories and the number of loops increase, thus leading to a lower processing speed.

SUMMARY OF THE INVENTION

It is an object of the present invention, therefore, to provide a technology related to acoustic characteristic calibration, which technology is superior to prior arts in at least one of improved repeatability of inspection state, a reduced influence of a noise in calibrating an acoustic characteristic, and a reduced load in FFT arithmetic processing.

An acoustic characteristic calibration method according to the present invention includes: a step of outputting a reference acoustic signal, the frequency characteristic of which is known, from a sound output unit and inputting the reference acoustic signal to a sound input unit of an acoustic inspection device; a step of subjecting the signal, which has been input to the sound input unit, to A/D conversion and then FFT arithmetic processing thereby to detect a frequency response characteristic of the sound input unit; and a step of determining a correction factor at each frequency by comparing the frequency response characteristic of the sound input unit and the frequency characteristic of the reference acoustic signal, and calibrating the frequency response characteristic of the sound input unit on the basis of the correction factor.

In the acoustic characteristic calibration method according to the present invention, preferably, the relative positions and attitudes of the sound output unit and the sound input unit are fixed by using an instrument which is fixed to a chassis of the acoustic inspection device and which is used to fix the sound output unit, and then the reference acoustic signal is output from the sound output unit.

In the acoustic characteristic calibration method according to the present invention, the instrument is preferably fixed to the chassis of the acoustic inspection device, avoiding the locations where acoustic inspection input interface and output interface, which are provided on the chassis of the acoustic inspection device, are disposed.

In the acoustic characteristic calibration method according to the present invention, the relative positions and attitudes of the sound output unit and the sound input unit are preferably fixed by using the instrument in which the sound output unit is disposed in a window formed of a through hole.

In the acoustic characteristic calibration method according to the present invention, the relative positions and attitudes of the sound output unit and the sound input unit are preferably fixed by using the instrument in which at least a portion where the sound output unit is fixed is composed of a transparent material.

In the acoustic characteristic calibration method according to the present invention, preferably, the relative positions and attitudes of the sound output unit and the sound input unit are fixed such that the interval between a vibration element of the sound output unit and a vibration detection element of the sound input unit is equal to or less than a half wavelength of an acoustic signal of a maximum frequency that defines the frequency characteristic of the sound input unit, and that the vibration element of the sound output unit and the vibration detection element of the sound input unit oppose each other.

In the acoustic characteristic calibration method according to the present invention, preferably, a plurality of calibration sonic signals $\psi_{sx}$ which have a specified inter-phase relationship are output from the sound output unit, a plurality of acoustic signals $\psi_{ox}$ input to the sound input unit accordingly are detected, and predetermined complex calculation is carried out on the plurality of acoustic signals ox so as to remove noise sonic signals $\psi_n$ which are included in the plurality of acoustic signals $\psi_{ox}$ and which are present in an environment of the acoustic inspection device, thereby detecting the frequency response characteristic of the sound input unit.

In the acoustic characteristic calibration method according to the present invention, preferably, each of a first calibration sonic signal $\psi_{s1}$ and a second calibration sonic signal $\psi_{s2}$, which have a specified relationship in which the phases are different, is output from the sound output unit, a first acoustic signal $\psi_{o1}$ and a second acoustic signal $\psi_{o2}$ input to the sound input unit accordingly are detected, and subtraction as the predetermined complex calculation is carried out on the first acoustic signal $\psi_{o1}$ and the second acoustic signal $\psi_{o2}$ thereby to detect a frequency response characteristic $|\psi_{o1}-\psi_{o2}|$ of the sound input unit.

In the acoustic characteristic calibration method according to the present invention, preferably, each of the first calibration sonic signal $\psi_{s1}$ and the second calibration sonic signal $\psi_{s2}$, which have a specified relationship in which the phases are the same, while the amplitudes are different, is output from the sound output unit, the first acoustic signal $\psi_{o1}$ and the second acoustic signal $\psi_{o2}$ input to the sound input unit accordingly are detected, and subtraction as the predetermined complex calculation is carried out on the first acoustic signal $\psi_{o1}$ and the second acoustic signal $\psi_{o2}$ thereby to detect a frequency response characteristic $|\psi_{o1}-\psi_{o2}|$ of the sound input unit.

In the acoustic characteristic calibration method according to the present invention, preferably, a butterfly arithmetic circuit for performing Fourier transform FFT (a discrete Fourier transform (DFT)) compares the configurations of circuits leading up to the bins of combinations that provide the same result after power value conversion out of the results obtained by reversing, at a Nyquist axis, an output result of a real image region and an output result of a mirror image region, and cuts a combination in which calculation closer to an initial stage in a butterfly arithmetic circuit composed of a plurality of stages can be deleted, thereby reducing the circuit scale of the butterfly arithmetic circuit.

According to the acoustic characteristic calibration method in accordance with the present invention, the repeatability of the inspection state is improved by using the instrument. The influence of a noise in acoustic characteristic calibration is reduced by carrying out the predetermined complex calculation on a plurality of acoustic signals detected in the case where a plurality of calibration sonic signals having a specified phase relationship are output. The processing load on an FFT circuit is reduced by using the improved butterfly calculation.

BRIEF DESCRIPTION OF THE DRAWINGS

FIG. 3A is a flowchart illustrating an acoustic characteristic calibration method as an embodiment of the present invention;

FIG. 3B is a flowchart illustrating an acoustic characteristic calibration method as another embodiment of the present invention;

FIG. 6 is an explanatory diagram illustrating a first embodiment of improved butterfly arithmetic processing;

FIG. 8 is a table illustrating the comparison of arithmetic processing volumes.

DESCRIPTION OF THE PREFERRED EMBODIMENTS (Configuration Related to Acoustic Characteristic Calibration)

Figure 1:
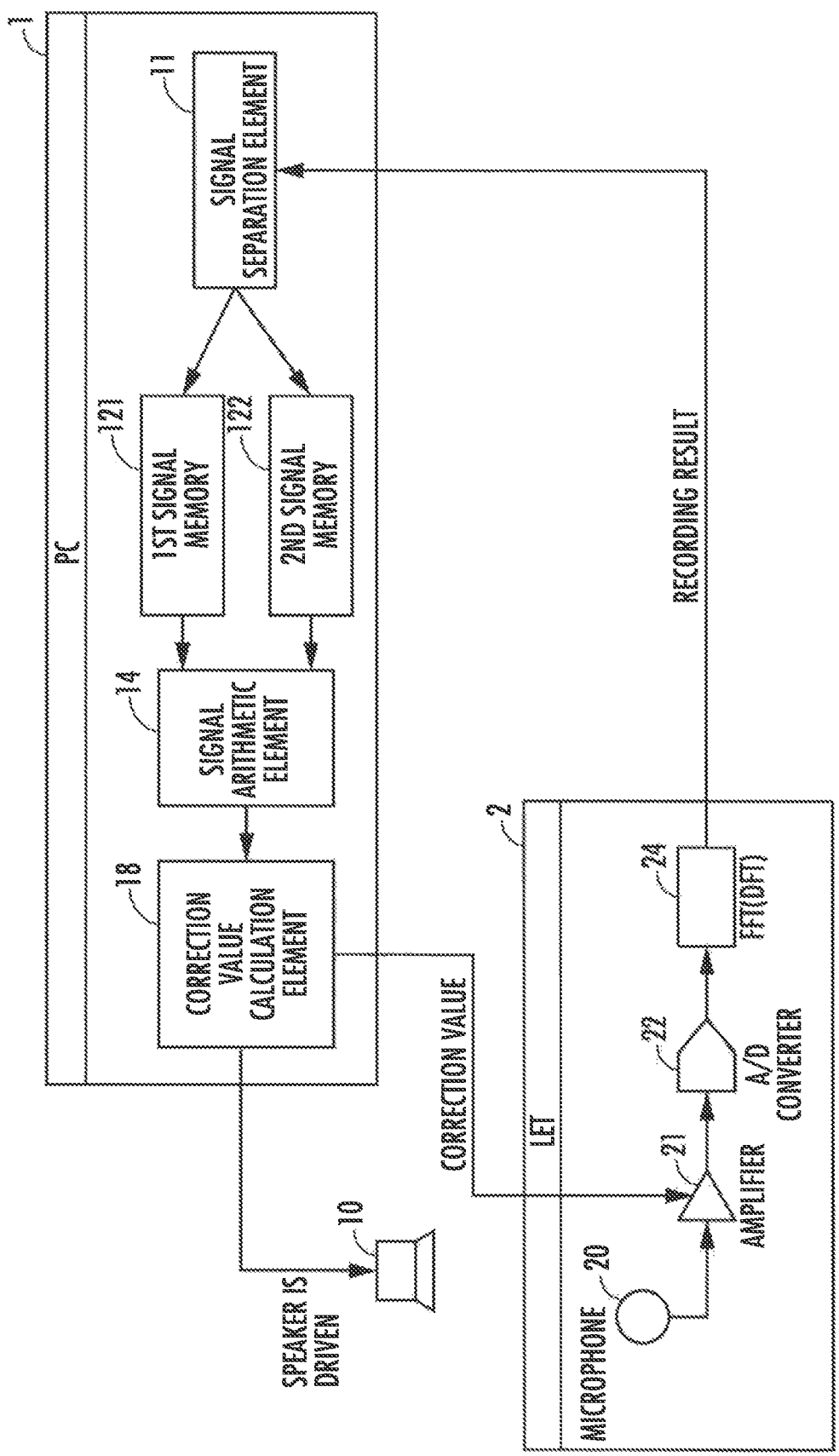
FIG. 1 is an explanatory diagram illustrating the configurations of an acoustic controller and a vehicle inspection device.

An acoustic controller 1 illustrated in FIG. 1 is used to calibrate the acoustic characteristic of a vehicle inspection device 2.

The acoustic controller 1 includes a sound output unit 10, a signal separation element 11, a first signal memory 121, a second signal memory 122, a signal arithmetic element 14, and a correction value arithmetic element 18. Each of the elements 11, 14 and 18 is composed of a processor or a processor core (hardware), which executes software and arithmetic processing based on the software. In the acoustic controller 1, some or all of the elements 10, 11, 121, 122, 14, and 18 may be the constituent elements of the vehicle inspection device 2.

The sound output unit 10 is composed of a speaker, and outputs an acoustic signal by vibrating a vibration plate (vibrating element). The signal separation element 11 separates an output signal from the vehicle inspection device 2 into a first acoustic signal and a second acoustic signal. The first signal memory 121 stores and retains the first acoustic signal separated by the signal separation element 11. The second signal memory 122 stores and retains the second acoustic signal separated by the signal separation element 11. The signal arithmetic element 14 carries out predetermined complex calculation on the first acoustic signal stored in the first signal memory 121 and the second acoustic signal stored in the second signal memory 122. The correction value arithmetic element 18 calculates the correction factor for calibrating the frequency response characteristic of the vehicle inspection device 2 or the sound input unit 20 on the basis of the result of comparison between the complex calculation result obtained by the signal arithmetic element 14 and the complex calculation result of a reference acoustic signal.

The vehicle inspection device 2 is connected to a plurality of ECUs (electronic control units) mounted in a vehicle, and used to determine or diagnose whether the plurality of ECUs are operating properly or not on the basis of the results of communication with the plurality of ECUs. Devices electrically connected to the ECUs mounted in the vehicle include acoustic devices, such as a meter alarm, a security horn, an audio speaker, a parking sensor buzzer, a smart buzzer, and an approach alarm. The vehicle inspection device 2 constitutes an acoustic inspection device for determining whether the sounds emitted from the acoustic devices are normal or not.

The vehicle inspection device 2 has the sound input unit 20, an amplifier 21, an A/D converter 22, and an FFT arithmetic element 24. The FFT arithmetic element 24 is composed of a dedicated circuit (hardware) in addition to a processor or a processor core that executes software and performs arithmetic processing according to software.

The sound input unit 20 is composed of a microphone, and an acoustic signal is input or detected by the vibration of a diaphragm (vibration detection element) caused by a sound wave. An acoustic signal input to the sound input unit 20 is amplified by the amplifier 21, and the amplified signal is converted from an analog signal into a digital signal by the A/D converter 22. The FFT arithmetic element 24 carries out FFT arithmetic processing, more specifically, the improved butterfly arithmetic processing in accordance with the present invention (refer to FIG. 6 and FIG. 7), on the digital signal, thereby extracting the acoustic signal at each frequency.

Figure 2A:
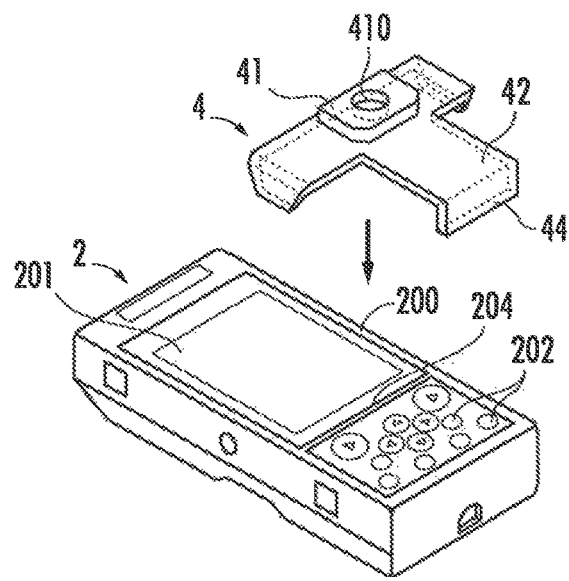
FIG. 2A is an explanatory diagram illustrating the configurations of the vehicle inspection device and an instrument.

As illustrated in FIG. 2A, the vehicle inspection device 2 has a chassis 200 (casing) shaped like an approximately rectangular parallelepiped. A display 201 is provided on the front upper side of the chassis 200, and a plurality of control buttons 202 are provided on the front lower side of the chassis 200. An opening 204 in communication with the sound input unit 20 is formed between the display 201 on the front surface of the chassis 200 and the plurality of control buttons 202. Each of the plurality of control buttons 202 constitutes an input interface operated by an inspection operator to enter commands for inspecting the functions or operations of the ECUs. Some of the control buttons 202 correspond to the control buttons for the acoustic inspection. The display 201 constitutes an output interface that displays the inspection results of the ECUs.

An instrument 4 illustrated in FIG. 2A is used to fix the relative positions and attitudes of the sound output unit 10 of an acoustic controller 1 and the sound input unit 20 of the vehicle inspection device 2. The instrument 4 includes a first base 41, which is shaped like an approximately rectangular plate, a second base 42 having an approximately T-shaped plate, which has a horizontal beam part shaped like an approximately rectangular plate transversely extending and a vertical beam part shaped like an approximately rectangular plate extending downward from the middle part of the horizontal beam part, and three hooks 44 which extend, two of the three hooks 44 being perpendicularly bent toward the rear at both ends of the horizontal beam part of the second base 42 and one being perpendicularly bent at the bottom end of the vertical beam part.

The first base 41 is attached or joined to the second base 42 such that the first base 41 is placed over the central portion of the horizontal beam part in the longitudinal direction (in the direction of thickness). At least the first base 41 and the second base 42 are composed of a transparent resin or material, such as Polyethylene terephthalate (PET). An approximately circular window 410, which passes through in the direction of thickness, is provided in the first base 41. A window 420, which passes through in the direction of thickness and which has a smaller diameter than the window 410, is provided at the center of the horizontal beam part of the second base 42.

The instrument 4 is fixed to the chassis 200 by bringing the hooks 44 into contact with the left side surface, the right side surface, and the bottom surface, respectively, of the chassis 200. Further, a buffer material, such as sponge or urethane (not illustrated), is used for the contact surfaces of the instrument 4 and the chassis 200, thus improving adhesiveness and reducing the influences of external sound entering through a gap.

Figure 2B:
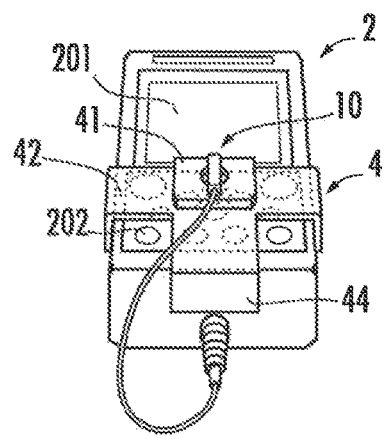
FIG. 2B is an explanatory diagram illustrating how the instrument is installed to the vehicle inspection device.

At this time, as illustrated in FIG. 2B, some of the control buttons 202 are exposed on both sides of the vertical beam part of the second base 42, and the aforesaid some of the control buttons 202 include the control buttons 202 for the acoustic inspection.

Figure 2C:
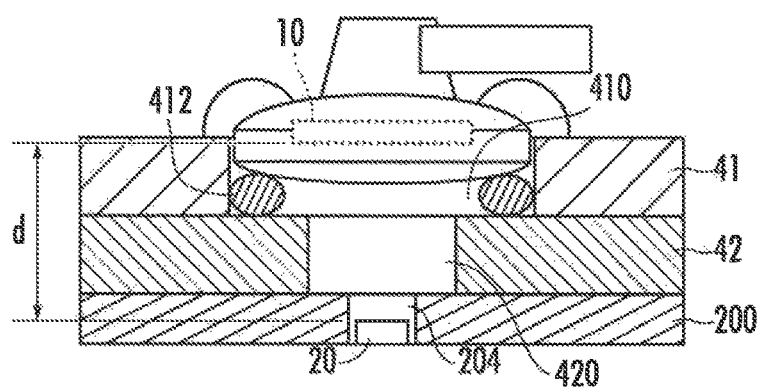
FIG. 2C is an explanatory diagram illustrating how a sound output unit and a sound input unit are disposed.

Further, as illustrated in FIG. 2C, the windows 410 and 420 of the instrument 4 match the opening 204 of the chassis 200 of the vehicle inspection device 2. In the window 410 of the first base 41, the sound output unit 10 is disposed such that the vibration plate thereof opposes the vibration detection element of the sound input unit 20 and an interval "d" is equal to or less than a half wavelength λmin/2 of a sound wave of a maximum frequency in a calibration object range.

The sound output unit 10 is disposed such that the sound output unit 10 is in contact with an annular gasket member 412, which is placed to be in contact with the front surface of the inner surface of the window 410 of the first base 41 and the front surface of the second base 42. The sound output unit 10 is fixed to the first base 41 by an adhesive or a thermoplastic resin.

(Acoustic Characteristic Calibration Method)

First, the sound output unit 10 is placed and fixed to the window 410 of the first base 41 of the instrument 4, and then the instrument 4 is fixed to the chassis 200 of the vehicle inspection device 2, as illustrated in FIG. 2B and FIG. 2C.

In the vehicle inspection device 2, it is determined whether the sound input unit 20 is ON (STEP202 of FIG. 3A). If the determination result is affirmative (YES in STEP202 of FIG. 3A), then a sound output ON command is output to the acoustic controller 1 from the vehicle inspection device 2 (STEP204 of FIG. 3A).

Figure 4A:
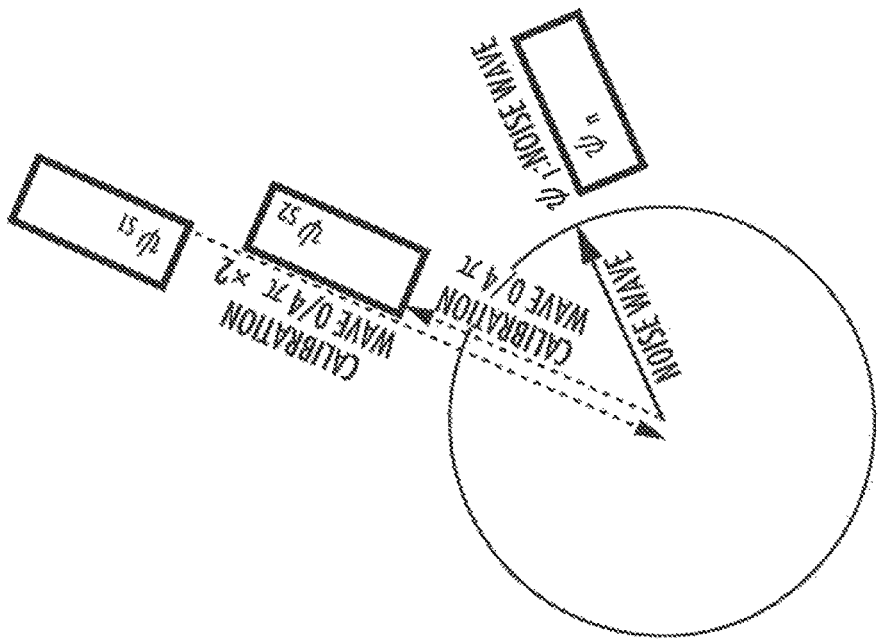
FIG. 4A is an explanatory diagram illustrating an example of the complex calculation of an acoustic signal.
Figure 5A:
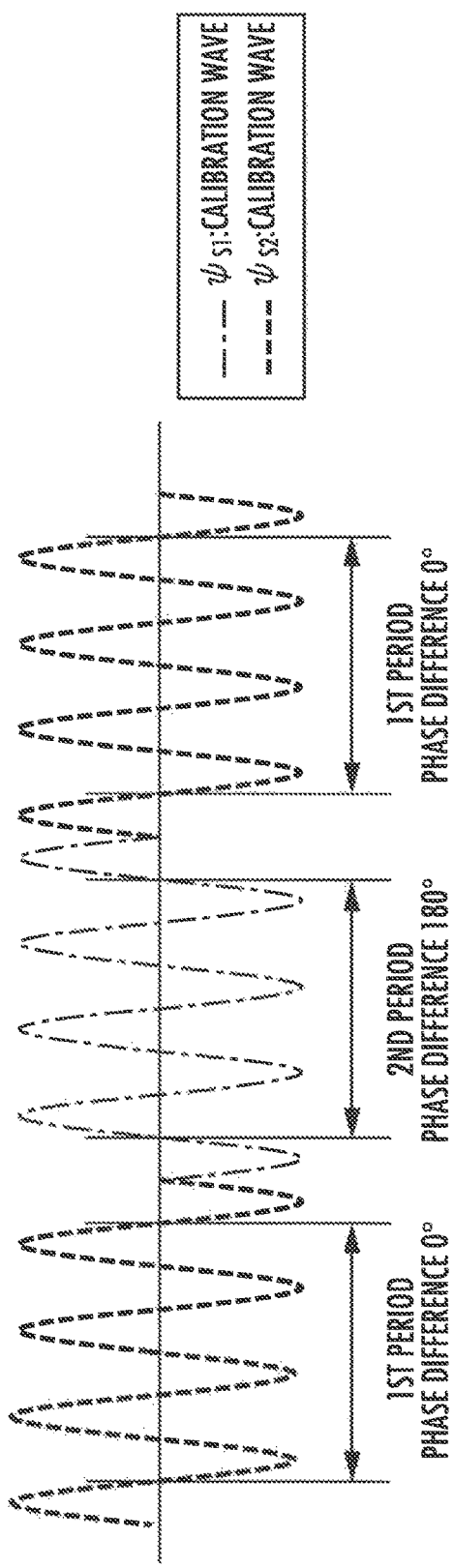
FIG. 5A is an explanatory diagram illustrating a first example of the temporal change of a reference acoustic signal.

In response to the command, the sound output unit 10 of the acoustic controller 1 continuously outputs a reference acoustic signal, the frequency characteristic of which is known (STEP102 of FIG. 3A). As the reference acoustic signals according to the present embodiment, a first calibration signal $\psi_{s1}$ and a second calibration signal $\psi_{s2}$, which have a specified relationship in which the phases thereof are different by 180 degrees, are output, being alternately switched in a first period and a second period, which is different from the first period, respectively (refer to FIG. 4A and FIG. 5A). The difference in phase between the first calibration signal $\psi_{s1}$ and a second calibration signal $\psi_{s2}$ may take other value (e.g. 45 degrees or 90 degrees) than 180 degrees.

Figure 4B:
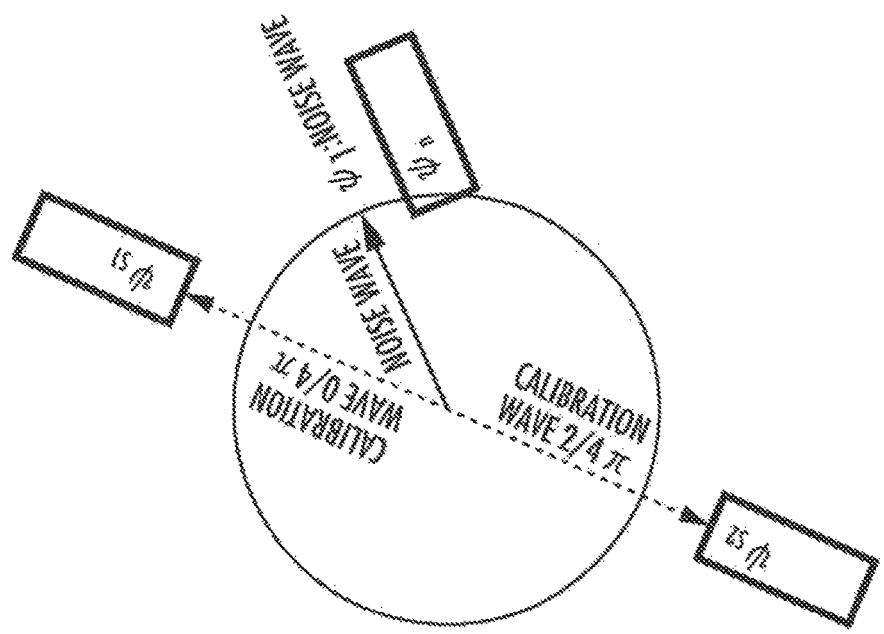
FIG. 4B is an explanatory diagram illustrating another example of the complex calculation of an acoustic signal.
Figure 5B:
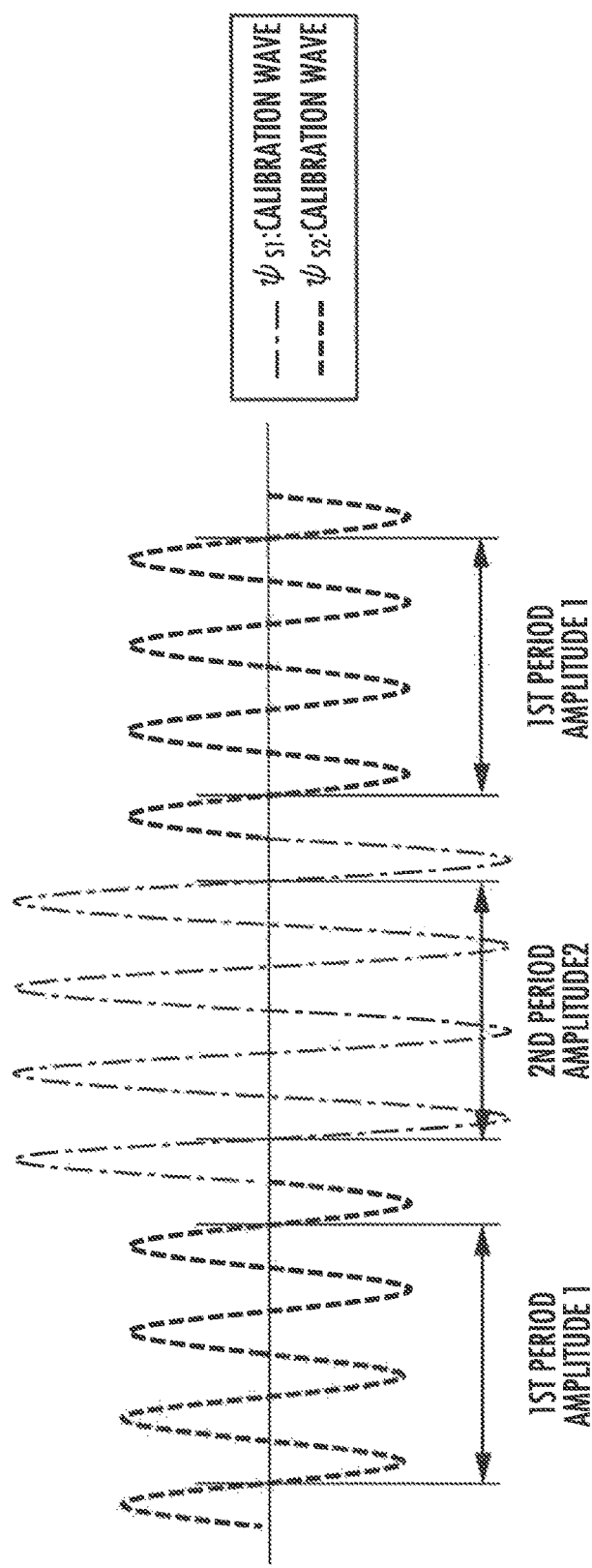
FIG. 5B is an explanatory diagram illustrating a second example of the temporal change of the reference acoustic signal.

Alternatively, as the reference acoustic signals, a first calibration signal $\psi_{s1}$ and a second calibration signal $\psi_{s2}$, which have a specified relationship in which the phases thereof are the same and which have different amplitudes, may be output in the first period and the second period, which is different from the first period, respectively (refer to FIG. 4B and FIG. 5B).

In the vehicle inspection device 2, it is determined whether a predetermined time has elapsed (STEP206 of FIG. 3A). If the determination result is negative (NO in STEP206 of FIG. 3A), then the acoustic signals continuously input to the sound input unit 20 are amplified and subjected to A/D conversion, and stored as digital signals in a storage device, which is not illustrated.

Meanwhile, if the determination result is affirmative (YES in STEP206 of FIG. 3A), then the vehicle inspection device 2 outputs a sound output OFF command to the acoustic controller 1 (STEP208 of FIG. 3A). In response to the command, the output of the reference acoustic signals from the sound output unit 10 is stopped in the acoustic controller 1 (STEP104 of FIG. 3A).

Thereafter, in the vehicle inspection device 2, the FFT calculation is carried out on the acoustic signals stored in the storage device (not illustrated), thereby to detect the frequency response characteristic (e.g. the intensity of an acoustic signal at each frequency) of the sound input unit 20 (STEP210 of FIG. 3A).

The frequency characteristic of the sound input unit 20 is transmitted from the vehicle inspection device 2 to the acoustic controller 1, and the first acoustic signal $\psi_{o1}$ and the second acoustic signal $\psi_{o2}$, which represent the frequency characteristics in the first period and the second period, respectively, are separated and then stored in the memories 121 and 122, respectively (STEP106 of FIG. 3A). Subtraction processing as the predetermined complex calculation is carried out on the first acoustic signal $\psi_{o1}$ and the second acoustic signal $\psi_{o2}$ (STEP108 of FIG. 3A (refer to FIG. 4A)). The result of the calculation, $|\psi_{o1}-\psi_{o2}|$ is compared with a difference $|\psi_{s1}-\psi_{s2}|$ between the first calibration signal $\psi_{s1}$ and the second calibration signal $\psi_{s2}$, and a correction factor is determined on the basis of the result of the comparison (STEP110 of FIG. 3A).

The correction factor is transmitted from the acoustic controller 1 to the vehicle inspection device 2 and reflected on the amplification factor of the amplifier 21, thereby calibrating the frequency response characteristic of the vehicle inspection device 2 or the sound input unit 20 (STEP212 of FIG. 3A).

In place of the flowchart illustrated in FIG. 3A, the flowchart illustrated in FIG. 3B may be used to calibrate the acoustic characteristic. The flowchart illustrated in FIG. 3B differs from the flowchart illustrated in FIG. 3A in that the processing in STEP210 is carried out before the processing in STEP206. The FFT processing is carried out (STEP210 of FIG. 3B) after the sound output ON command is issued from the vehicle inspection device 2 to the acoustic controller 1 (STEP204 of FIG. 3B), and then it is determined in the vehicle inspection device 2 whether the predetermined time has elapsed (STEP206 of FIG. 3B). If the determination result is negative (NO in STEP206 of FIG. 3B), then the FFT processing is carried out (STEP210 of FIG. 3B).

Thus, the acoustic signals continuously input to the sound input unit 20 are subjected to the amplification and the A/D conversion, and the FFT processing is concurrently carried out in succession. Therefore, when the sound output OFF command (STEP208 of FIG. 3B) is output, the FFT processing result of the frequency response characteristic (e.g. the intensity of the acoustic signal at each frequency) of the sound input unit 20 is obtained.

(Improved Butterfly Calculation)

In the FFT arithmetic processing (refer to STEP210 of FIG. 3A and STEP210 of FIG. 3B), the improved butterfly calculation is carried out. The butterfly calculation for carrying out the FFT arithmetic processing (DFT) provides a real image region section and a mirror image region section, which are parted at a Nyquist frequency fs/2.

The difference between the signals in the real image region section and the mirror image region section is denoted by a reversed sign of an imaginary signal (Q output), so that conversion to power values provides results that are laterally symmetrical with respect to the Nyquist frequency fs/2. Therefore, the bin of the calculation result of the mirror image region section can be folded back and replaced by the bin of the result of the real image region section. In other words, the calculation volume of the FFT arithmetic processing (DFT) can be reduced by cutting one of the equivalent bins.

The following describes a specific example of the cutting. When equivalent output bins are compared, one bin includes rotation calculation in the calculation base in a block constituting the butterfly calculation, whereas the other bin does not include the rotation calculation in the calculation base in a block constituting the butterfly calculation. Therefore, the calculation volume of the FFT arithmetic processing (DFT) can be cut down by reducing the arithmetic load by cutting the butterfly calculation part that includes the rotation calculation involving a large calculation volume (the result obtained after scrambling (bit reversal processing) is the same as the result of FFT arithmetic processing (DFT) of normal algorithm).

FIG. 6 illustrates the configuration of the improved butterfly arithmetic processing applied to a radix 2 FFT configuration.

Figure 7:
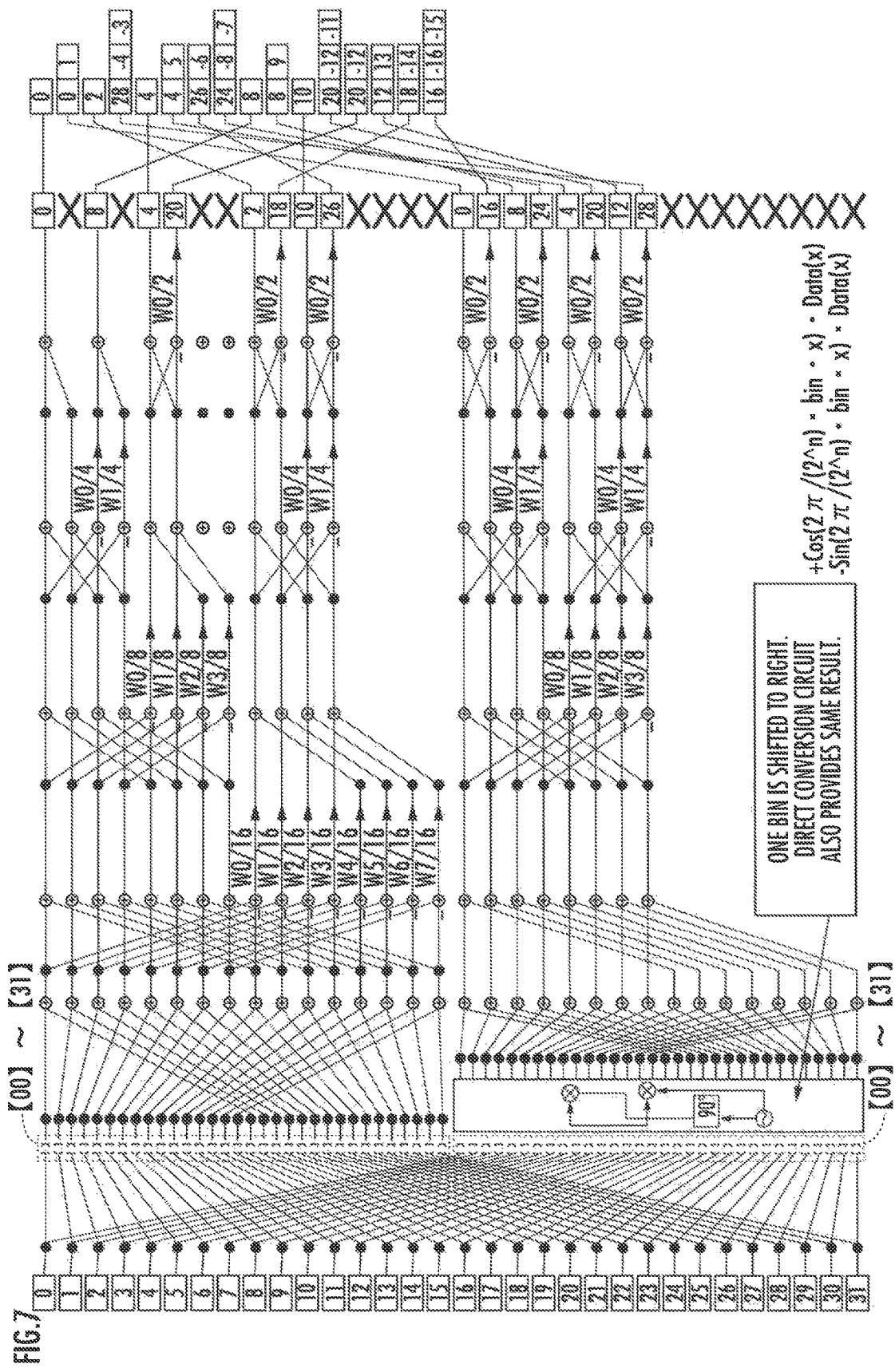
FIG. 7 is an explanatory diagram illustrating a second embodiment of the improved butterfly arithmetic processing.

Further, FIG. 7 illustrates a configuration in which a direct conversion circuit is introduced in a part of the butterfly calculation circuit (FFT circuit) illustrated in FIG. 6, and signals are shifted by one bin beforehand to obtain the same effect.

FIG. 8 illustrates conventional butterfly arithmetic processing load and the butterfly arithmetic processing load according to the present invention. If the number of times of complex addition/subtraction and the number of times of the rotation calculation are both 1 in standard butterfly calculation which does not use a mirror image, then the number of times of the complex addition/subtraction is 0.60 and the number of times of the rotation calculation is 0.45 in the improved butterfly calculation which uses a mirror image and constitutes a final stage by addition/subtraction, thus proving that the arithmetic processing load has been reduced.

What is claimed is:

1. An acoustic characteristic calibration method comprising:
    a step of outputting a reference acoustic signal, a frequency characteristic of which is known, from a sound output unit and inputting the reference acoustic signal to a sound input unit of an acoustic inspection device;
    a step of subjecting the signal, which has been input to the sound input unit, to analog-digital (A/D) conversion and then fast Fourier transform (FFT) arithmetic processing thereby to detect a frequency response characteristic of the sound input unit; and
    a step of determining a correction factor at each frequency by comparing the frequency response characteristic of the sound input unit and the frequency characteristic of the reference acoustic signal, and calibrating the frequency response characteristic of the sound input unit based on the correction factor,
    wherein each of a first calibration sonic signal $\psi_{s1}$ and a second calibration sonic signal $\psi_{s2}$, which have a specified inter-phase relationship in which phases are different, is output from the sound output unit, and a first acoustic signal $\psi_{o1}$ and a second acoustic signal $\psi_{o2}$ input to the sound input unit are detected according to the first calibration sonic signal $\psi_{s1}$ and the second calibration sonic signal $\psi_{s2}$, and
    subtraction as a predetermined complex calculation is carried out on the first acoustic signal $\psi_{o1}$ and the second acoustic signal $\psi_{o2}$ so as to remove noise sonic signals $\psi_n$ which are included in the first acoustic signal $\psi_{o1}$ and the second acoustic signal $\psi_{o2}$ and which are present in an environment of the acoustic inspection device, thereby detecting the frequency response characteristic $|\psi_{o1}-\psi_{o2}|$ of the sound input unit.

2. The acoustic characteristic calibration method according to claim 1,
    wherein relative positions and attitudes of the sound output unit and the sound input unit are fixed by using an instrument which is fixed to a chassis of the acoustic inspection device and which is used to fix the sound output unit, and then the reference acoustic signal is output from the sound output unit.

3. The acoustic characteristic calibration method according to claim 2,
    wherein the instrument is fixed to the chassis of the acoustic inspection device, avoiding the locations where acoustic inspection input interface and output interface, which are provided on the chassis of the acoustic inspection device, are disposed.

4. The acoustic characteristic calibration method according to claim 2,
wherein the relative positions and attitudes of the sound output unit and the sound input unit are fixed by using the instrument in which the sound output unit is disposed in a window formed of a through hole.

5. The acoustic characteristic calibration method according to claim 2,
wherein the relative positions and attitudes of the sound output unit and the sound input unit are fixed by using the instrument in which at least a portion where the sound output unit is fixed is composed of a transparent material.

6. The acoustic characteristic calibration method according to claim 2,
wherein the relative positions and attitudes of the sound output unit and the sound input unit are fixed such that an interval between a vibration element of the sound output unit and a vibration detection element of the sound input unit is equal to or less than a half wavelength of an acoustic signal of a maximum frequency that defines the frequency characteristic of the sound input unit, and also that the vibration element of the sound output unit and the vibration detection element of the sound input unit oppose each other.

7. The acoustic characteristic calibration method according to claim 1,
wherein calculation using a butterfly arithmetic circuit as an FFT circuit for performing Fourier transform is selectively performed in FFT arithmetic processing, and
the FFT circuit compares configurations of circuits leading up to bins of combinations that provide a same result after power value conversion out of results obtained by reversing, at a Nyquist axis, an output result of a real image region and an output result of a mirror image region, and cuts a combination in which calculation closer to an initial stage in the butterfly arithmetic circuit composed of a plurality of stages can be deleted, thereby reducing a circuit scale of the butterfly arithmetic circuit.

8. An acoustic characteristic calibration method comprising:
a step of outputting a reference acoustic signal, a frequency characteristic of which is known, from a sound output unit and inputting the reference acoustic signal to a sound input unit of an acoustic inspection device;
a step of subjecting the signal, which has been input to the sound input unit, to analog-digital (A/D) conversion and then fast Fourier transform (FFT) arithmetic processing thereby to detect a frequency response characteristic of the sound input unit; and
a step of determining a correction factor at each frequency by comparing the frequency response characteristic of the sound input unit and the frequency characteristic of the reference acoustic signal, and calibrating the frequency response characteristic of the sound input unit based on the correction factor,
wherein each of a first calibration sonic signal $\psi_{s1}$ and a second calibration sonic signal $\psi_{s2}$, which have a specified inter-phase relationship in which phases are the same, while amplitudes are different, is output from the sound output unit, a first acoustic signal $\psi_{o1}$ and a second acoustic signal $\psi_{o2}$ input to the sound input unit accordingly are detected according to the first calibration sonic signal $\psi_{s1}$ and the second calibration sonic signal $\psi_{s2}$, and
subtraction as a predetermined complex calculation is carried out on the first acoustic signal $\psi_{o1}$ and the second acoustic signal $\psi_{o2}$ so as to remove noise sonic signals $\psi_n$ which are included in the first acoustic signal $\psi_{o1}$ and a second acoustic signal $\psi_{o2}$ and which are present in an environment of the acoustic inspection device, thereby detecting the frequency response characteristic $|\psi_{o1}-\psi_{o2}|$ of the sound input unit.

9. An acoustic characteristic calibration device comprising: a sound output unit; a calibrator; and an instrument, wherein
the sound output unit outputs a reference acoustic signal which is to be input to a sound input unit of an acoustic inspection device, and a frequency characteristic of which is known,
the calibrator compares a frequency response characteristic of the sound input unit, the frequency response characteristic having been detected by a detector of the acoustic inspection device by carrying out FFT arithmetic processing on the reference acoustic signal which has been input to the sound input unit and which has been subjected to analog-digital (A/D) conversion, and the frequency characteristic of the reference acoustic signal thereby to determine a correction factor at each frequency, and calibrates the frequency response characteristic of the sound input unit based on the correction factor,
the instrument is detachably fixable to a chassis of the acoustic inspection device and is used to fix the sound output unit, the instrument configured to detachably fix relative positions and attitudes of the sound output unit and the sound input unit such that an interval between a vibration element of the sound output unit and a vibration detection element of the sound input unit is equal to or less than a half wavelength of an acoustic signal of a maximum frequency that defines the frequency characteristic of the sound input unit, and also that the vibration element of the sound output unit and the vibration detection element of the sound input unit oppose each other,
the sound output unit outputs each of a first calibration sonic signal $\psi_{s1}$ and a second calibration sonic signal $\psi_{s2}$, which have a specified inter-phase relationship in which phases are different, so that a first acoustic signal $\psi_{o1}$ and a second acoustic signal $\psi_{o2}$ are input to and detected by the sound input unit, and
the calibrator carries out subtraction as a predetermined complex calculation on the first acoustic signal $\psi_{o1}$ and the second acoustic signal $\psi_{o2}$ so as to remove noise sonic signals $\psi_n$ which are included in the first acoustic signal $\psi_{o1}$ and the second acoustic signal $\psi_{o2}$ and which are present in an environment of the acoustic inspection device, thereby detecting the frequency response characteristic $|\psi_{o1}-\psi_{o2}|$ of the sound input unit.

10. An acoustic characteristic calibration device comprising: a sound output unit; a calibrator; and an instrument, wherein
the sound output unit outputs a reference acoustic signal which is to be input to a sound input unit of an acoustic inspection device, and a frequency characteristic of which is known,
the calibrator compares a frequency response characteristic of the sound input unit, the frequency response characteristic having been detected by a detector of the acoustic inspection device by carrying out FFT arithmetic processing on the reference acoustic signal which has been input to the sound input unit and which has been subjected to analog-digital (A/D) conversion, and the frequency characteristic of the reference acoustic signal thereby to determine a correction factor at each frequency, and calibrates the frequency response characteristic of the sound input unit based on the correction factor, the instrument is detachably fixable to a chassis of the acoustic inspection device and is used to fix the sound output unit, the instrument configured to detachably fix relative positions and attitudes of the sound output unit and the sound input unit such that an interval between a vibration element of the sound output unit and a vibration detection element of the sound input unit is equal to or less than a half wavelength of an acoustic signal of a maximum frequency that defines the frequency characteristic of the sound input unit, and also that the vibration element of the sound output unit and the vibration detection element of the sound input unit oppose each other, the sound output unit outputs each of a first calibration sonic signal $\psi_{s1}$ and a second calibration sonic signal $\psi_{s2}$, which have a specified inter-phase relationship in which phases are the same while amplitudes are different, so that a first acoustic signal $\psi_{o1}$ and a second acoustic signal $\psi_{o2}$ are input to and detected by the sound input unit, and the calibrator carries out subtraction as a predetermined complex calculation on the first acoustic signal $\psi_{o1}$ and the second acoustic signal $\psi_{o2}$ so as to remove noise sonic signals $\psi_n$ which are included in the first acoustic signal $\psi_{o1}$ and the second acoustic signal $\psi_{o2}$ and which are present in an environment of the acoustic inspection device, thereby detecting the frequency response characteristic $|\psi_{o1} - \psi_{o2}|$ of the sound input unit.

\* \* \* \* \*